US011935930B2

(12) United States Patent
Frougier et al.

(10) Patent No.: US 11,935,930 B2
(45) Date of Patent: Mar. 19, 2024

(54) WRAP-AROUND-CONTACT FOR 2D-CHANNEL GATE-ALL-AROUND FIELD-EFFECT-TRANSISTORS

(71) Applicant: International Business Machines Corporation, Armonk, NY (US)

(72) Inventors: Julien Frougier, Albany, NY (US); Ruilong Xie, Niskayuna, NY (US); Kangguo Cheng, Schenectady, NY (US); Chanro Park, Clifton Park, NY (US); Andrew Gaul, Halfmoon, NY (US)

(73) Assignee: International Business Machines Corporation, Armonk, NY (US)

( * ) Notice: Subject to any disclaimer, the term of this patent is extended or adjusted under 35 U.S.C. 154(b) by 143 days.

(21) Appl. No.: 17/456,947

(22) Filed: Nov. 30, 2021

(65) Prior Publication Data

US 2023/0170394 A1    Jun. 1, 2023

(51) Int. Cl.
*H01L 29/41* (2006.01)
*H01L 29/40* (2006.01)
(Continued)

(52) U.S. Cl.
CPC ...... *H01L 29/41741* (2013.01); *H01L 29/401* (2013.01); *H01L 29/42392* (2013.01); *H01L 29/66666* (2013.01); *H01L 29/7827* (2013.01)

(58) Field of Classification Search
CPC ............ H01L 29/41741; H01L 29/401; H01L 29/42392; H01L 29/66666; H01L 29/7827;
(Continued)

(56) References Cited

U.S. PATENT DOCUMENTS 4,262,296 A    4/1981  Shealy et al.
6,838,721 B2   1/2005  Garni et al.
(Continued)

FOREIGN PATENT DOCUMENTS

CN    105470001 A    4/2016
CN    107039515 A    8/2017
(Continued)

OTHER PUBLICATIONS

Manuel Mencarelli, "Investigation of low temperature SiGe epitaxy with high order precursors," IMEC, dated Apr. 2021, pp. 1-73.
(Continued)

*Primary Examiner* — Mohammad M Hoque
(74) *Attorney, Agent, or Firm* — Patterson + Sheridan, LLP

(57) ABSTRACT

Embodiments herein describe FETs with channels that form wrap-around contacts (a female portion of a female/male connection) with metal contacts (a male portion of the female/male connection) in order to connect the channels to the drain and source regions. In one embodiment, a first conductive contact is formed underneath a dummy channel. In addition an encapsulation material wraps around the first conductive contact. The dummy channel and the encapsulation material can then be removed and replaced by the material of the channel which, as a result, include a female portion that wraps around the first conductive contact.

20 Claims, 15 Drawing Sheets

(51) Int. Cl.
*H01L 29/417* (2006.01)
*H01L 29/423* (2006.01)
*H01L 29/66* (2006.01)
*H01L 29/78* (2006.01)

(58) Field of Classification Search
CPC ............... H01L 21/743; H01L 29/0847; H01L 29/1606; H01L 29/24; H01L 29/45; H01L 29/66742; H01L 29/78642; H01L 29/78681; H01L 29/78684; H01L 29/78696
USPC ........................................................ 257/329
See application file for complete search history.

(56) References Cited

U.S. PATENT DOCUMENTS

| | | | |
|---|---|---|---|
| 8,471,249 B2 | 6/2013 | Chiu et al. | |
| 8,679,902 B1 | 3/2014 | Basker et al. | |
| 8,742,511 B2 | 6/2014 | Chang et al. | |
| 8,916,914 B2 | 12/2014 | Kim et al. | |
| 9,349,806 B2 | 5/2016 | Ho et al. | |
| 9,490,323 B2 | 11/2016 | Rodder et al. | |
| 9,508,801 B2 | 11/2016 | Franklin et al. | |
| 9,548,394 B2 | 1/2017 | Das et al. | |
| 9,553,199 B2 | 1/2017 | Hou et al. | |
| 9,748,352 B2 | 8/2017 | Liu et al. | |
| 9,812,449 B2 | 11/2017 | Obradovic et al. | |
| 9,853,053 B2 | 12/2017 | Lupino et al. | |
| 10,134,915 B2 | 11/2018 | Colinge et al. | |
| 10,283,603 B2 | 5/2019 | Yang | |
| 10,388,732 B1 | 8/2019 | Frougier et al. | |
| 10,804,398 B2 | 10/2020 | Frougier et al. | |
| 10,818,803 B1 | 10/2020 | Frougier et al. | |
| 11,127,859 B2* | 9/2021 | Tsai | H01L 29/78642 |
| 11,482,538 B2* | 10/2022 | Liu | H01L 21/28537 |
| 2010/0213538 A1* | 8/2010 | Fukuzumi | G11C 16/0483 257/326 |
| 2012/0138887 A1 | 6/2012 | Zhang et al. | |
| 2012/0273763 A1 | 11/2012 | Banerjee et al. | |
| 2017/0317206 A1 | 11/2017 | van Dal et al. | |
| 2018/0182898 A1 | 6/2018 | Moroz et al. | |
| 2019/0067326 A1* | 2/2019 | Huang | H01L 29/165 |
| 2019/0067475 A1* | 2/2019 | Liu | H01L 29/267 |
| 2019/0386145 A1 | 12/2019 | Ok et al. | |
| 2020/0219997 A1 | 7/2020 | Mehandru et al. | |
| 2021/0098294 A1 | 4/2021 | Smith et al. | |
| 2021/0135015 A1 | 5/2021 | Frougier | |

FOREIGN PATENT DOCUMENTS

| | | |
|---|---|---|
| CN | 113206091 A | 8/2021 |
| CN | 114613850 A | 6/2022 |
| EP | 3255656 A1 | 12/2017 |
| EP | 3608965 A1 | 2/2020 |
| WO | 2011160922 A1 | 12/2011 |

OTHER PUBLICATIONS

PCT, Notification of Transmittal of The International Search Report and The Written Opinion of The International Searching Authority, or The Declaration for Application PCT/CN2022/133196 dated Feb. 15, 2023.

* cited by examiner

WRAP-AROUND-CONTACT FOR 2D-CHANNEL GATE-ALL-AROUND FIELD-EFFECT-TRANSISTORS

BACKGROUND

The present invention relates to female and male connections between channel and metal contacts in a vertical field-effect transistor (VFET).

A Gate-All-Around (GAA) FET such as a Vertical-Transport-FET is one of the lead device architectures for continuing CMOS scaling beyond Horizontal-Transport Devices. However just like other MOSFET technology it is based on crystalline Si integration. As the width of the channels shrink, connecting the vertical channels to a metal contact becomes a limiting factor.

SUMMARY

According to one embodiment of the present invention, a vertical field-effect transistor (VFET) that includes a vertical channel, a top conductive contact where a top end of the vertical channel wraps around the top conductive contact, and a bottom conductive contact disposed on a substrate where a bottom end of the vertical channel wraps around the bottom conductive contact.

One embodiment of the present invention is a field-effect transistor (FET) that includes a channel, a first conductive contact where a first end of the channel and the first conductive contact form a first female/male connection, and a second conductive contact where a second end of the channel opposite the first end and the second conductive contact form a second female/male connection.

One embodiment of the present invention is a method that includes forming a bottom conductive contact on a substrate, forming an encapsulation material that wraps around the bottom conductive contact where the encapsulation material is disposed between the bottom conductive contact and a dummy channel, removing the encapsulation material and the dummy channel, forming a permanent channel in a volume vacated by the encapsulation material and the dummy channel, and forming a top conductive contact at a top end of the permanent channel, wherein the bottom conductive contact, the permanent channel, and the top contact are part of a VFET.

DETAILED DESCRIPTION

Embodiments herein describe VFETs (or more generally, GAA FETs) with channels that form wrap-around contacts (a female portion of a female/male connection) with metal contacts (a male portion of the female/male connection) in order to connect the channels to drain and source regions. In one embodiment, a buried metal line is formed underneath a dummy channel. In addition, an encapsulation material wraps around the buried metal line. The dummy channel and the encapsulation material can then be removed and replaced by the material of the channel which, as a result, includes a female portion that wraps around the buried metal line.

Although the embodiments herein can be used with a vertical channel with any width to reduce the contact resistance between the channel and the metal contact, they may be particularly advantageous as the width of the channel is shrunk to less than 10 nm, and more particularly, to less than 5 nm. In that case, instead of using silicon, the channel may be formed from a 2D-material such as transition metal dichalcogenide material such as $MoS_2$, $MoSe_2$, $MoTe_2$, $HfS_2$, $ZrS_2$, $WS_2$, $WSe_2$, $SnS$, or hexagonal boron nitride h-BN, or at least one oxide-semiconductor such as ITO, ZnO, IGZO, InGaZnO, InAlZnO, or Graphene, or a 1D-material such as carbon nanotubes.

While the embodiments herein describe using the ends of the vertical channel as the female portion of the female/male connection, in other embodiments the process can be modified so that the channel forms a male portion while the metal contact forms the female portion.

Figure 1:
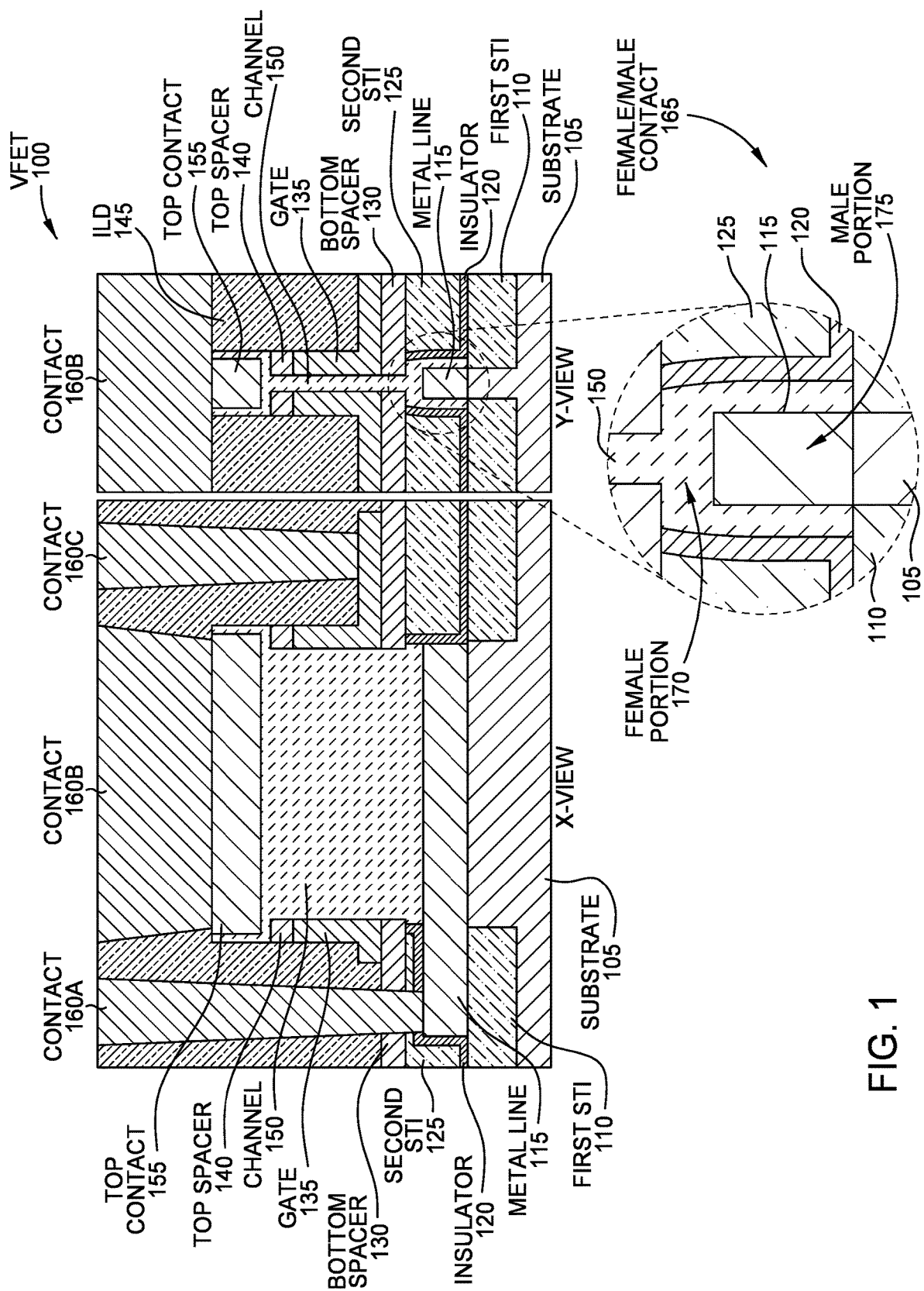
FIG. 1 illustrates a VFET with female/male connections between a vertical channel and metal contacts, according to one embodiment.

FIG. 1 illustrates a VFET 100 with female/male connections between a vertical channel 150 and metal contacts, according to one embodiment. FIG. 1 illustrates orthogonal cross sections of the VFET 100 (an X-view and Y-view). The VFET 100 is formed on a substrate 105 (e.g., a semiconductor substrate, a dielectric, or an integrated structure that can include one more electrical structures (e.g., metal routing layers)) that has been etched to include a first shallow trench isolation (STI) 110. A buried metal line 115 forms a bottom conductive contact disposed at a first end of the channel 150 while a top metal contact 155 is disposed on an opposite end of the channel 150.

As shown, a second, shallower STI 125 is disposed in the same plane as the metal line 115. The first and second STIs 110 and 125 can provide electrical insulation between neighboring VFETs.

An insulator 120 (e.g., silicon nitride or other insulator) is disposed between the second STI 125 and the buried metal line 115. However, a contact 160A extends through the insulator 120 to make an electrical connection to the metal line 115. Although not shown, the contact 160A can connect to a source/drain (S/D) region located elsewhere in an integrated circuit (IC) containing the VFET 100.

A bottom spacer 130 is disposed on the second STI 125 and the insulator 120. A gate 135 (e.g., a conductor) is disposed on the bottom spacer 130 and the sides of the channel 150. While not shown, the gate 135 is insulated from the channel 150 by a thin gate dielectric (e.g., a high-k material). By controlling the voltage on the gate 135, the VFET 100 can be turned on and off. Unlike horizontal FETs where the gate is disposed on a plane parallel with the substrate, the gate 135 in the VFET 100 extends in a direction perpendicular to the substrate 105 along the vertical sides of the channel 150. The contact 160C makes an electrical connection with the gate 135 in order to control the gate voltage.

A top spacer 140 is disposed between the gate and a top end of the channel 150. Moreover, the top end of the channel 150 electrically contacts the top metal contact 155 which is in turn electrically connected to a contact 160B. Although not shown, the contact 160B can be electrically connected to a S/D region located elsewhere on the IC containing the VFET 100.

Further, an inter-layer dielectric (ILD) 145 provides insulation between the contacts 160 of the VFET 100 as well as insulation between the VFET 100 and contacts for neighboring VFETs (not shown).

The electrical connection between the top and bottom ends of the channel 150, the metal line 115, and the top metal contact 155 is an important feature to the performance of the VFET 100. A poor electrical connection can degrade the operation of the VFET 100. However, ensuring a good electrical connection has become difficult as transistors have shrunk. Transistors down-sizing is arriving at fundamental and practical limits. Monolithic 3D integration, however, can offer cost-effective, large-scale implementation of nanoelectronic systems. It offers the largest gains in transistors-per-chip and solves the on-chip interconnect and communication gridlock and thus energy, speed, and bandwidth problems.

VTFET architecture is proposed as an architecture to continue logic scaling beyond lateral transport devices such as Nanosheet. Lateral transport device scaling beyond 40 nm CPP faces fundamental challenges for various reasons. However just like other MOSFET technology, lateral transport devices are typically based on crystalline Si integration. This requirement can quickly become a limiting factor for monolithic 3D integration. Reducing the Si sheet width below 5 nm to improve electrostatic control is difficult, if not impossible, since quantum confinement effects start to degrade performance. However, the use of 2D materials as the channel 150 can permit ultra-thin channels (e.g., less than 5 nm). 2D materials can include a transition metal dichalcogenide material such as $MoS_2$, $MoSe_2$, $MoTe_2$, $HfS_2$, $ZrS_2$, $WS_2$, $WSe_2$, SnS, or hexagonal boron nitride h-BN, or at least one oxide-semiconductor such as ITO, ZnO, IGZO, InGaZnO, InAlZnO, or Graphene, etc. However, formation of vertical contact with 2D materials is still not established due to the ultra-thin thickness of the material when used as the channel 150.

FIG. 1 illustrates a female/male connection 165 to support the ultra-thin thickness of a channel 150 formed from 2D materials. While the embodiments herein discuss using the female/male connection 165 on a ultra-thin channel 150 (e.g., a width of 0.5-5 nm), it can also be used on wider channels 150 (e.g., a width of 5-50 nm) which may be formed from other materials besides a 2D material, such as a traditional Si channel. Put differently, the female/male connection 165 can provide an improved electrical connection regardless of the thickness of the channel 150. Further, the embodiments herein can be used on any material that permits an ultra-thin channel 150 whether the channel 150 is made from 2D material or some other material. For example, a 1D material such as carbon nanotubes can be used to form an ultra-thin channel 150.

As shown in the blow-out image in FIG. 1, the female/male connection 165 is formed from a portion of the channel 150 forming a female portion 170 while a portion of the metal line 115 forms a male portion 175. In this example, the female portion 170 wraps around the male portion 175, and thus, the female/male connection 165 can also be referred to as a wrap-around connection. The female portion 170 of the channel 150 contacts the top, left, and right sides of the male portion 175 of the metal line 115. Further, the female portion 170 of the channel 150 and the male portion 175 of the metal line 115 both directly contact the substrate 105 (e.g., a common substrate), although this is not required. In any case, the female/male connection 165 provides an improved electrical connection between the channel 150 and the metal line 115 relative to connecting the channel 150 to only the top side or surface of the metal line 115.

In addition to forming a female/male connection 165 at the bottom end of the channel 150, FIG. 1 illustrates forming a female/male connection at the top end of the channel 150. There, the channel 150 wraps around the left side, bottom side, and right side of the top contact 155. Again, the top end of the channel 150 forms a female portion of the female/male connection while the top contact 155 forms the male portion. This results in an improved electrical connection between the channel 150 and the metal contact relative to contacting the channel 150 to only a bottom side of the top contact 155.

As shown, the channel 150 wraps around the top contact 155 and the metal line 115 but has a middle or central portion with a smaller width. Specifically, in this embodiment, both the top contact 155 and the metal line 115 are wider than the smallest width of the channel 150 (e.g., the width at the center or middle of the channel 150). For example, the top contact 155 and the metal line 115 may have a width between 5-50 nm.

Figure 2:
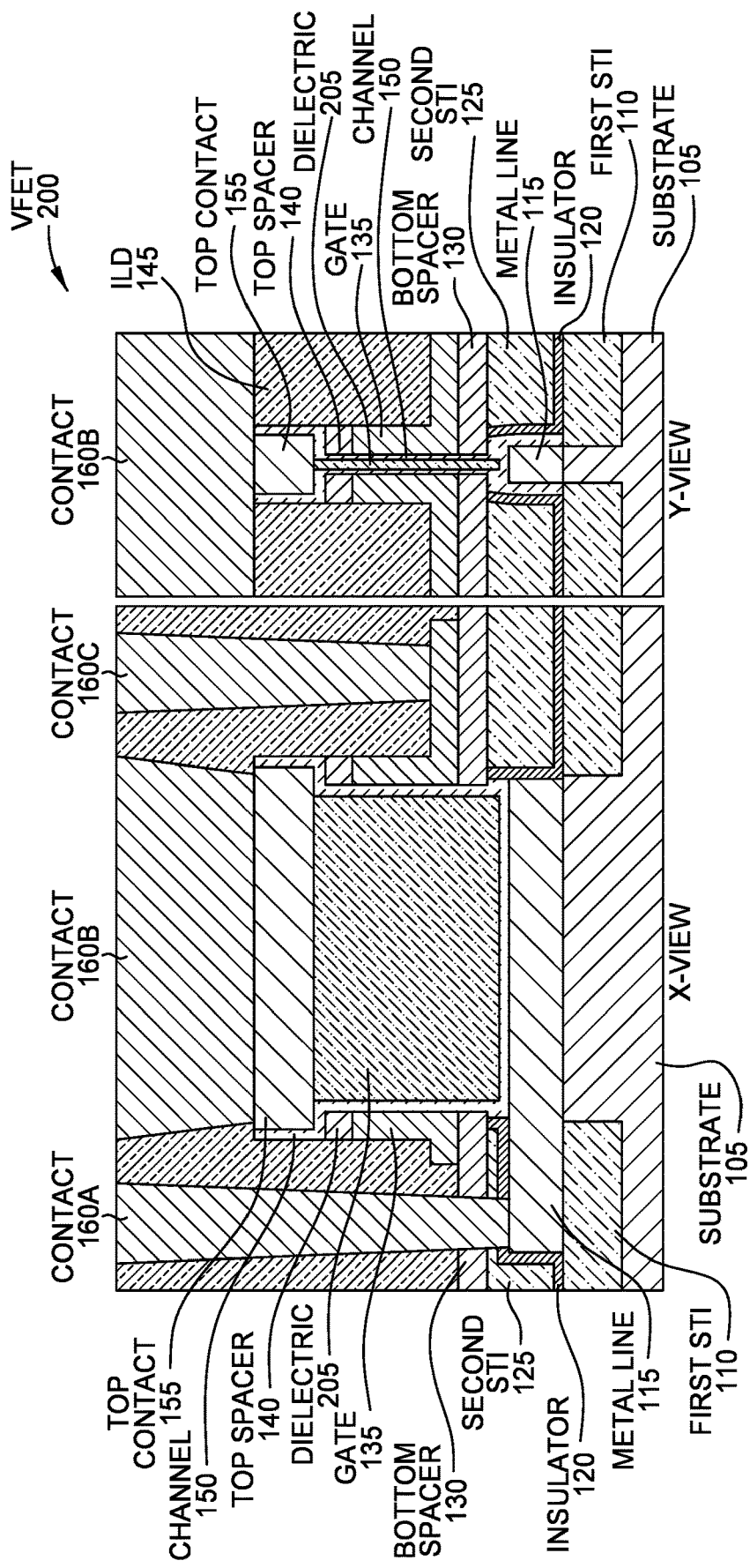
FIG. 2 illustrates a VFET with female/male connections between a vertical channel and metal contacts, according to one embodiment.

FIG. 2 illustrates a VFET 200 with female/male connections between a vertical channel and metal contacts, according to one embodiment. The VFET 200 has the same components as the VFET 100 except with the addition of a dielectric 205 within the channel 150. As such, the same references numbers are used in FIG. 2 to indicate the same components.

In FIG. 1, the channel 150 is fully pinched-off by the material used to form the channel 150. In contrast, in FIG. 2, the channel 150 is not pinched by the material of the channel but instead a low-K dielectric 205 is inserted in the middle of the channel region. However, in both embodiments illustrated in FIGS. 1 and 2, the top and bottom ends of the channel 150 form female/male connections with the buried metal line 115 and the top contact 155. The low-K dielectric 205 can provide additional structural support to the VFET. If the channel region is not fully pinched off with the 2D material, the dielectric 205 can be used to complete the cavity fill to provide structural integrity and prevent the metal of top contact 155 from filling the channel region and creating a short.

Figure 3A:
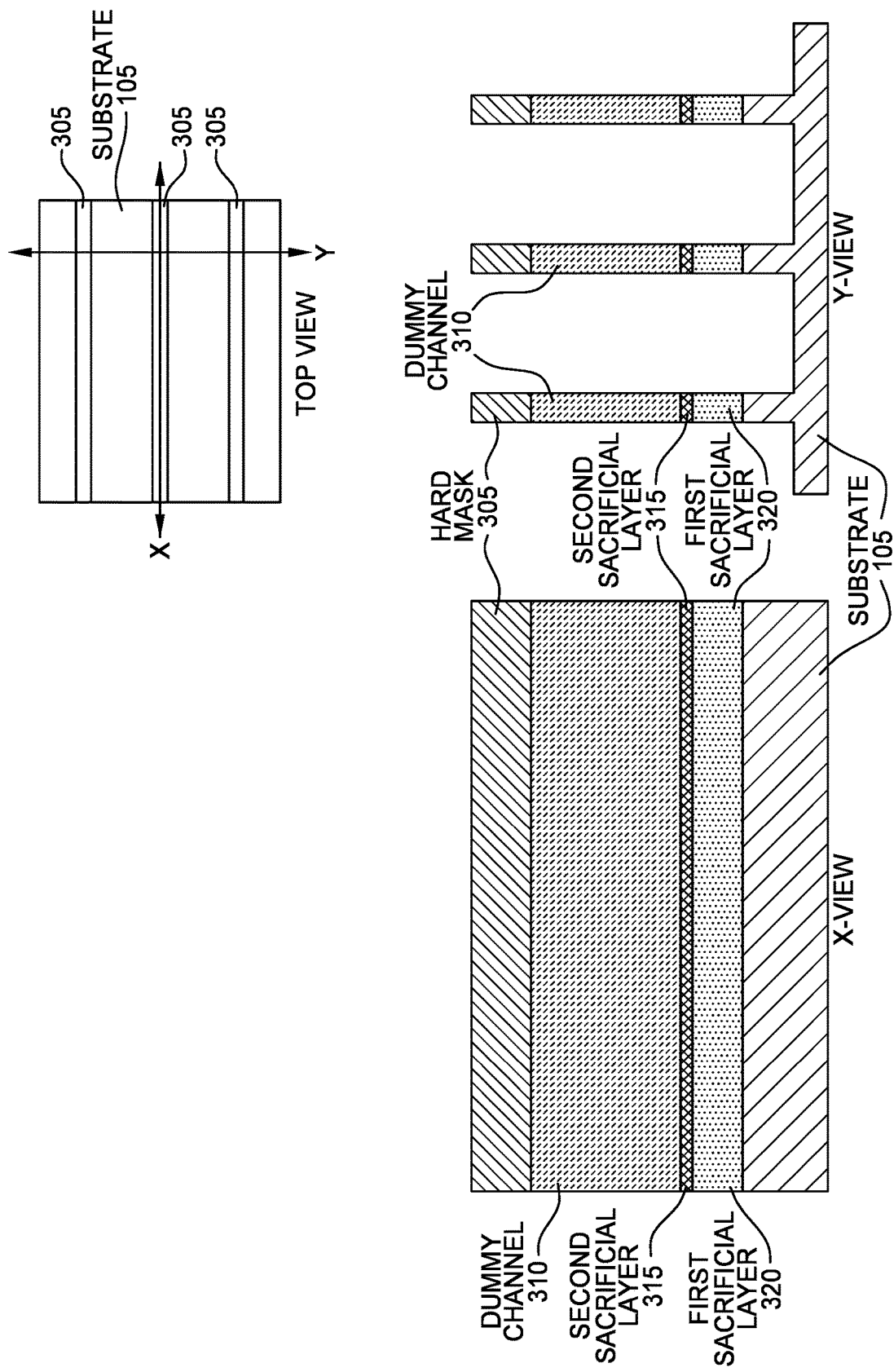
FIGS. 3A-3L illustrate forming a VFET with female/male connections, according to one embodiment.

FIGS. 3A-3L illustrate forming a VFET with female/male connections, according to one embodiment. FIG. 3A illustrates a structure formed on the substrate 105 (e.g., a silicon substrate) that includes a first sacrificial layer 320, and a second sacrificial layer 315, a dummy channel 310, and a hard mask 305. In one embodiment, the first sacrificial layer 320 is formed from silicon germanium, or more specifically, SiGeX % (where X ranges from 45-70%. The second sacrificial layer 315 may be also be formed from silicon germanium but with a different ratio, e.g., SiGeY % (where Y ranges from 20-35%). But the specific material used in the first and second sacrificial layers 315, 320 is not important so long as the material is different (so the two layers 315, 320 can be etched during two separate etching steps described below) and permit a selective etch so that other materials in the structure are not affected when the sacrificial layers 315, 320 are being removed.

In one embodiment, the dummy channel 310 is formed from crystalline silicon, but is not limited as such. As described below, the dummy channel 310 is eventually removed from the structure (like the sacrificial layers 315, 320) and replaced by the "permanent" channel material. Thus, the dummy channel 310 provides a template for later forming the actual channel for the VFET. In one embodiment, the thickness of the sacrificial layer 315 ranges from 3-15 nm. In one embodiment, the thickness of the sacrificial layers 320 ranges from 10-40 nm. In one embodiment, the thickness of the dummy channel 310 ranges from 15-100 nm.

The structure in FIG. 3A has already been processed to form three fins extending in the X direction. Further, as shown by the Y-view, the substrate 105 has been etched below the second sacrificial layer 320. In one embodiment, before etching the structure to form the three fins, the first and second sacrificial layers 320, 315 and the dummy channel may be deposited epitaxially onto the substrate 105. The hard mask 305 can then be patterned on top so the structure can be etched to form the three fins.

Figure 3B:
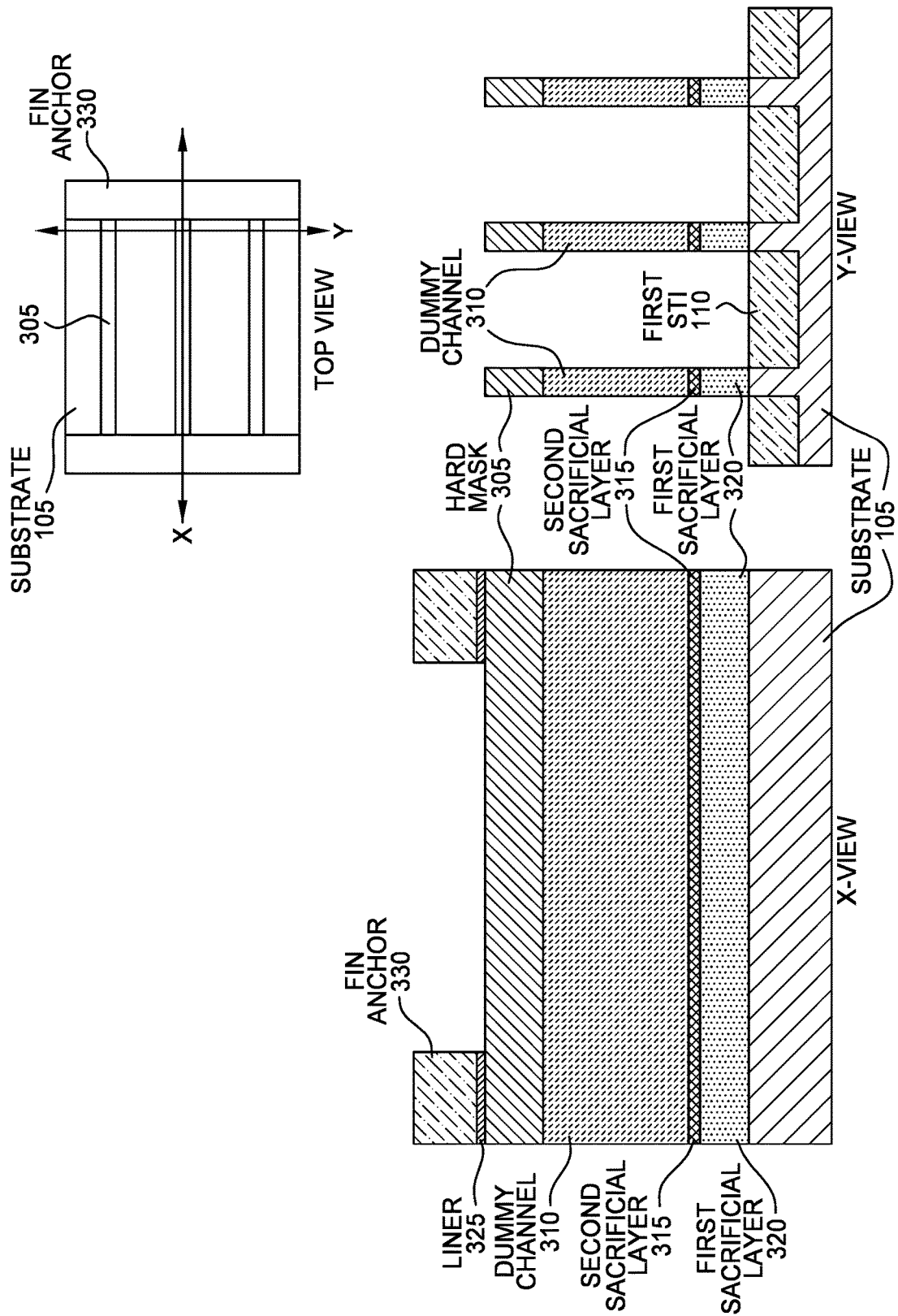

FIG. 3B illustrates depositing an dielectric liner 325 (e.g., an oxide) and fin anchors 330 on the ends of the fins. The fin anchors 330 provide support for the fins when the sacrificial layers 320, 315 are removed in later processing steps.

In addition, the first STI 110 is formed in the region between the fins that is below the first sacrificial layer 320. The STI 110 can be an oxide or any suitable insulative material.

Figure 3C:
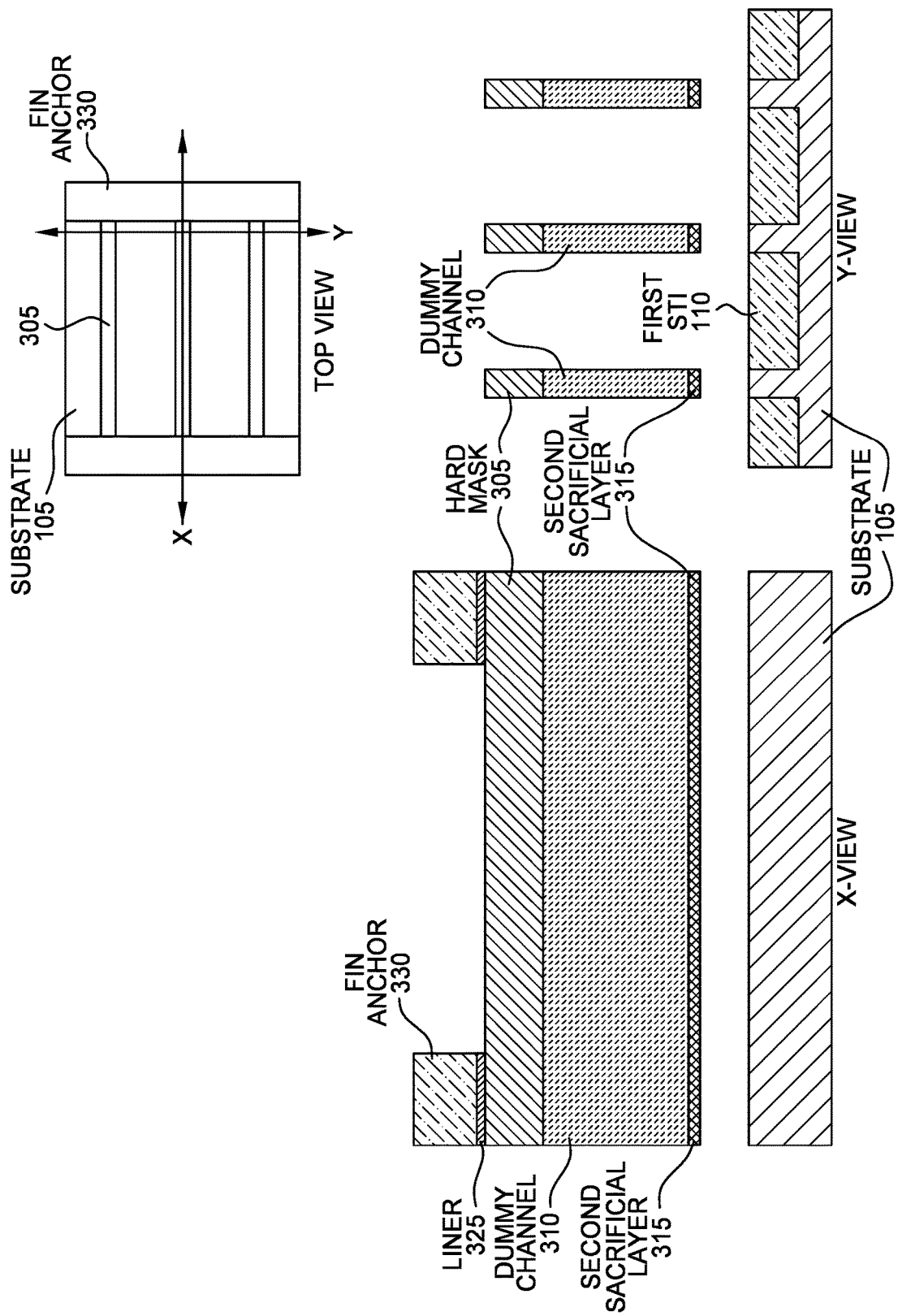

FIG. 3C illustrates removing the first sacrificial layer 320 from the structure illustrated in FIG. 3B. As mentioned above, the etch process used to remove the first sacrificial layer 320 can be selective so it does not remove the second sacrificial layer 315 (or any of the other material in the structure). As mentioned above, the fin anchors 330 provide support at each end of each of the fins so that they are suspended above the substrate 105 after the first sacrificial layer 320 is removed.

Figure 3D:
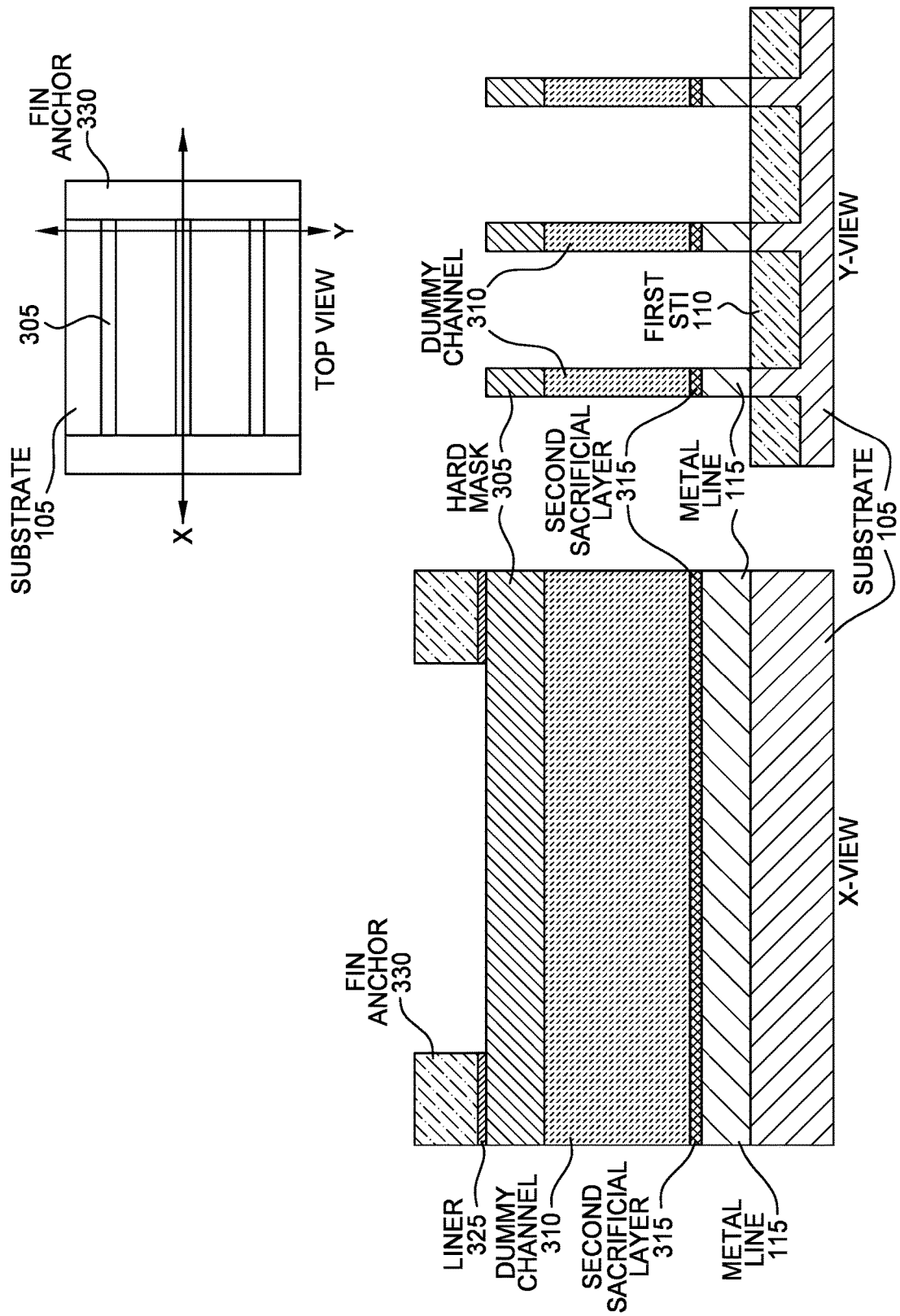

FIG. 3D illustrates forming the buried metal line 115 within the volume previously occupied by the first sacrificial layer 320. In one embodiment, a conformal metal deposition is used to deposit the material of the metal line 115 within the volume previously occupied by the first sacrificial layer 320. However, this results in this material being deposited in other regions of the structure. An isotropic metal etch back can then be performed in order to remove the excess material so that the metal line is formed only within the volume previously occupied by the first sacrificial layer 320.

Figure 3E:
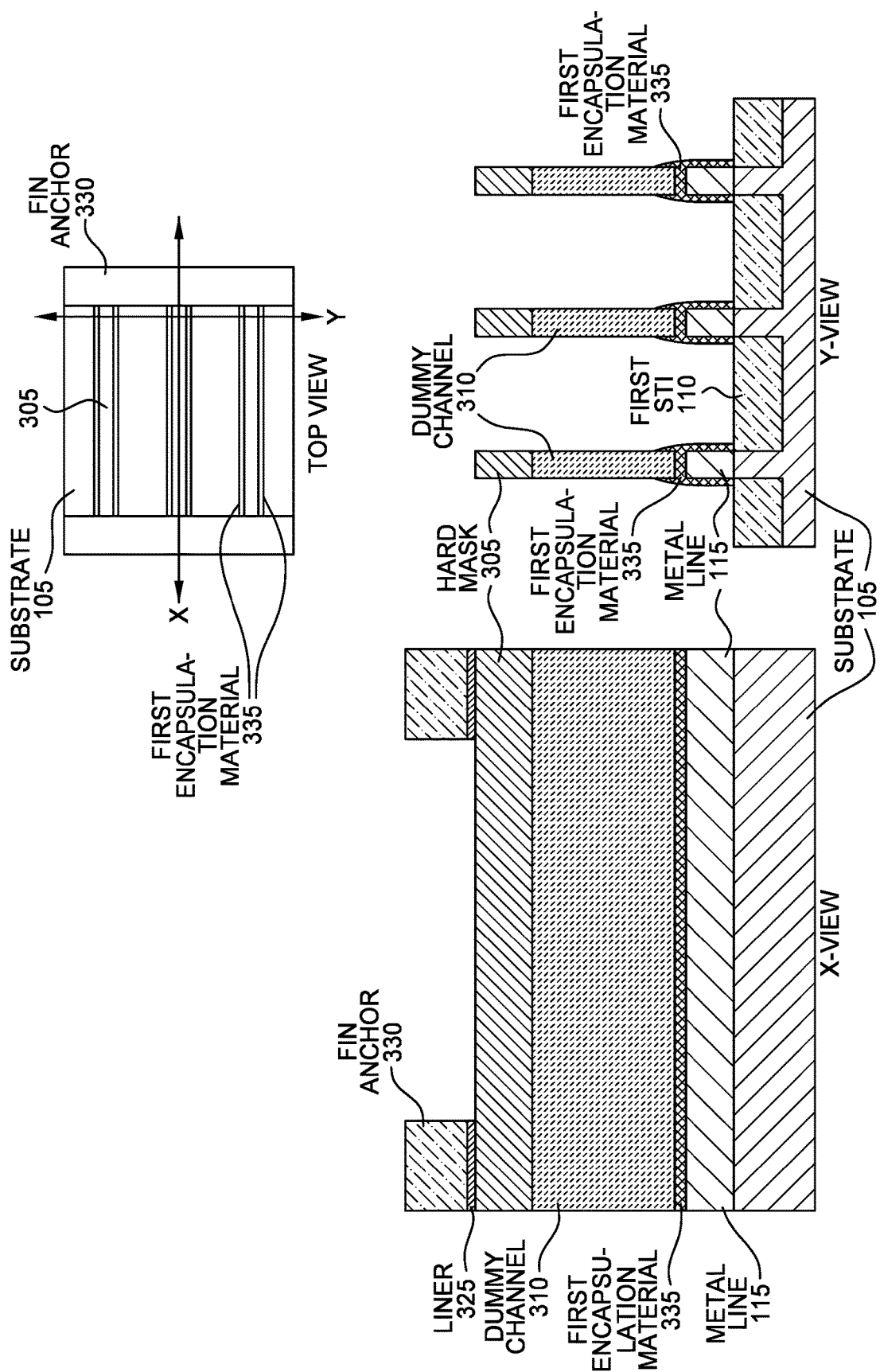

FIG. 3E illustrates removing the second sacrificial layer 315 from the structure illustrated in FIG. 3D and replacing it with a first encapsulation material 335. As mentioned above, the etch process used to remove the second sacrificial layer 320 can be selective so it does not affect any of the other material in the structure. Also, the fin anchors 330 continue to provide support at each end of each of the fins so that the dummy channels 310 and the hard mask 305 portions of the fin are suspended above the buried metal line 115 after the second sacrificial layer 315 is removed.

After removing the second sacrificial layer 315, the first encapsulation material 335 is conformally deposited onto the structure such that it occupies the volume previously occupied by the second sacrificial layer 315, as well as the sides of the metal lines 115, the sides of the dummy channels 310, and other portions of the structures. An anisotropic etch back can then be used to remove the first encapsulation material 335 from the undesired regions of the structure. In this case, it is desired that some of the first encapsulation material 335 remain on the sides of the metal lines 115 in order to encapsulate the metal lines 115. As a result of this goal, some of the first encapsulation material 335 will likely remain on the sides of the dummy channels 310, but it can be removed in later process steps. Stated differently, it may not be desired to have the first encapsulation material 335 on the sides of the dummy channel 310 but this may be a consequence of ensuring the first encapsulation material 335 fully encapsulates the metal lines 115.

In one embodiment, the first encapsulation material 335 is AlO, but is not limited to this material. The first encapsulation material 335 can be any material that wraps around the metal line 115 and can serve as a template for forming the female portions of the channels in later processing steps.

Figure 3F:
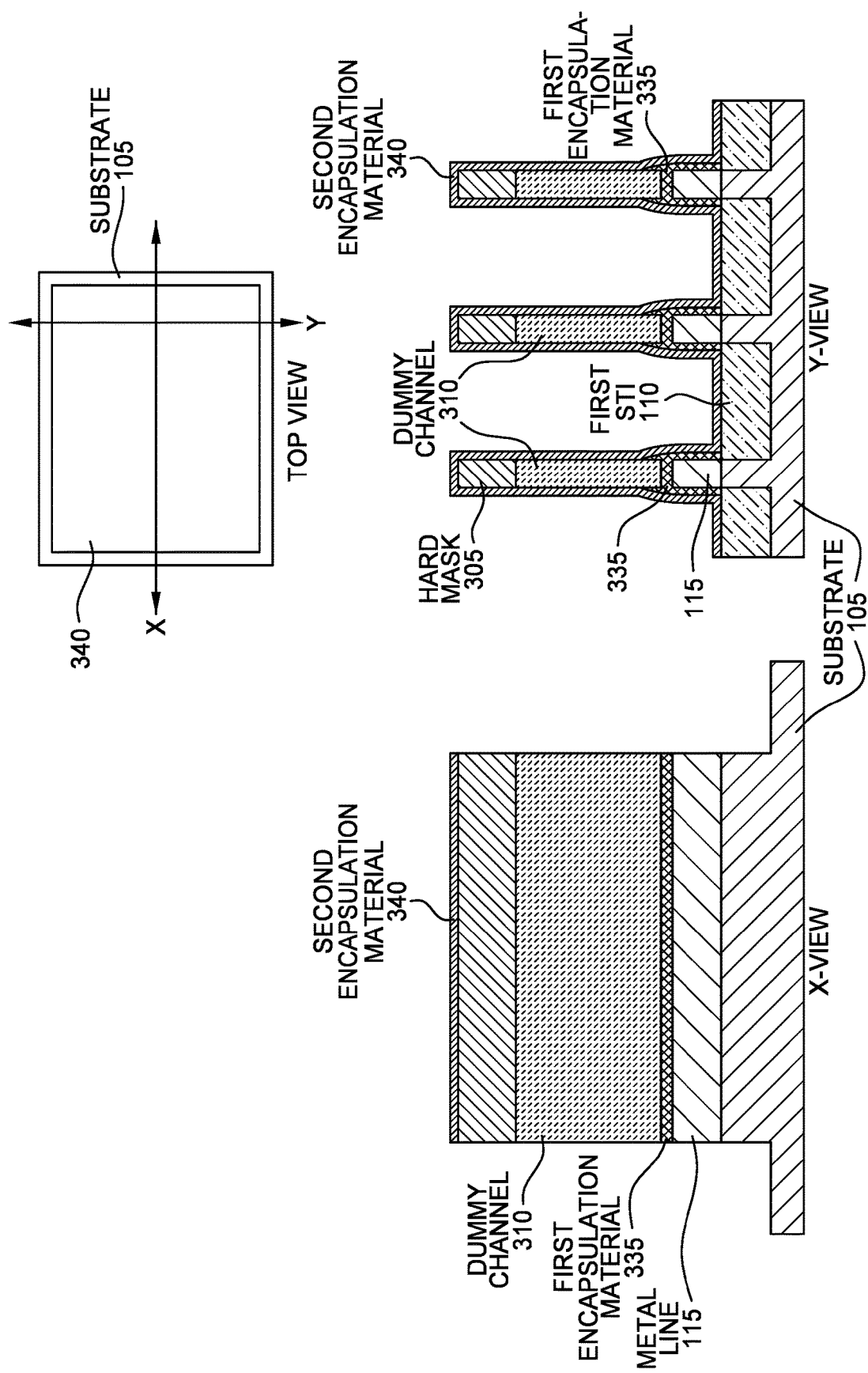

FIG. 3F illustrates removing the fin anchors 330 and the dielectric liner 325. That is, because the sacrificial layers have been backfilled with the metal lines 115 and the first encapsulation material 335, the anchors 330 are no longer needed. A second encapsulation material 340 is then conformally deposited on the top of the structure after the anchors 330 and the dielectric liner 325 have been removed. Doing so ensures the second encapsulation material 340 encapsulates the fins and the first encapsulation material 335. In one embodiment, the second encapsulation material 340 is a silicon nitride or other suitable material. Further, the second encapsulation material 340 may have a thickness of 1-4 nm, and in one embodiment, has a thickness of 1.5-2.5 nm.

After depositing the second encapsulation material 340, the ends of the fins are etched to shorten their length. In one embodiment, a reactive ion etch (RIE) process is used to remove the various layers at the ends of the fins in order to reduce their length. Before performing the RIE, a patterning step can be performed to expose the fin regions recessed by the cut versus the region where the fins are preserved. Here, the substrate 105 is also etched down to be substantially parallel with the bottom of the STI 110.

Figure 3G:
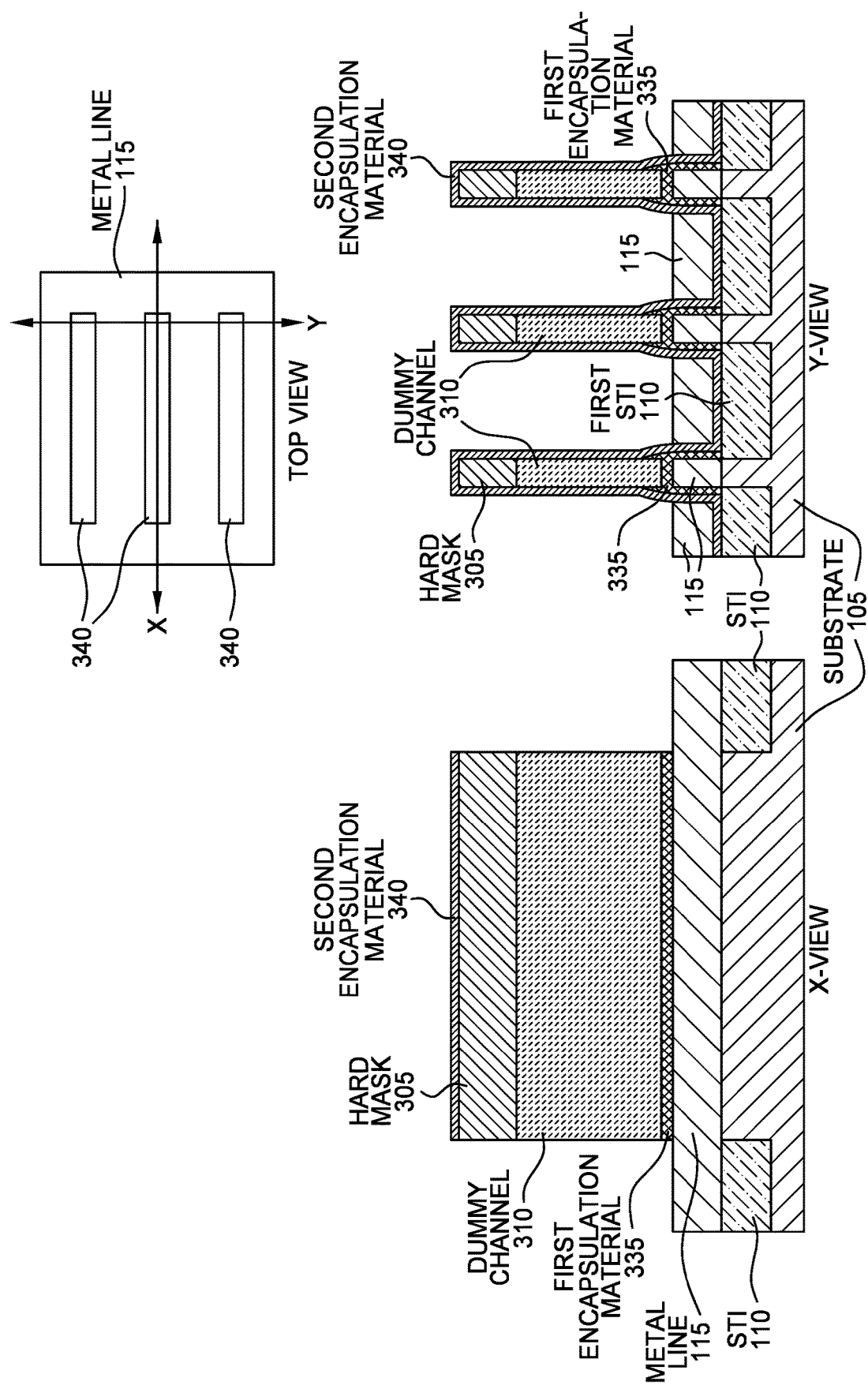

The X-view of FIG. 3G illustrates forming more of the first STI 110 at the ends of the fins. The first STI 110 can be formed using a pinch-off/etch back process where conformal oxide is deposition is pinched-off in a horizontal direction and then an isotropic oxide etch back can be used to form the STI 110 shown in FIG. 3G.

Once the remaining portions of the first STI 110 are formed, the metal line 115 is extended to provide a landing for an electrical contact to the metal line 115. That is, additional metal can be deposited onto the structure and then etched back.

Figure 3H:
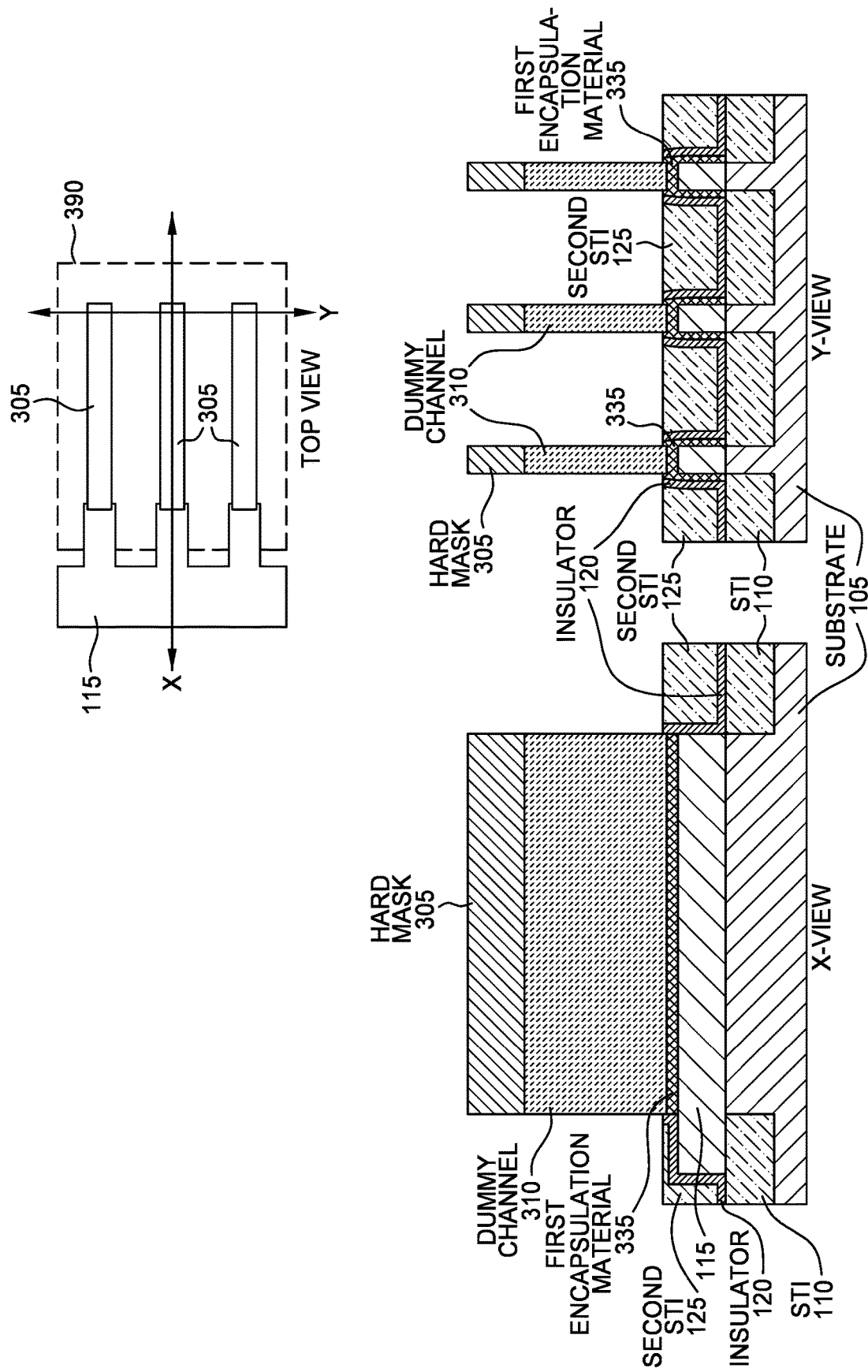

FIG. 3H illustrates the results of several additional processing steps. First, the left portion of the metal line 115 in the X-view can be covered (or masked) followed by an etching step to remove the remaining metal from the structure that is not underneath one of the fins. The left portion of the metal line 115 covered by the masking material will be used to provide a contact or landing for the metal line 115. The left portion can also be called an extension of the buried metal line 115.

The masking material can then be removed and additional material of the insulator 120 is deposited to cover the left portion of the metal line 115 and the right portion of the STI 110 as shown in the X-view. The second STI 125 is then deposited on the insulator 120.

The second STI 125, the insulator 120, and the first encapsulation material 335 are then etched to form the structure in FIG. 3H. Notably, the exposed, top surfaces of the second STI 125, the insulator 120, and the first encapsulation material 335 are slightly above the bottom side of the dummy channels 310. If there materials are below the bottom of the dummy channel 310 there is a risk of thinning the first encapsulation material 335 and replacing it with subsequently deposited material. In that case, the cavity to fit the final channel might become too small to do a proper deposition. As such, in FIG. 3H the bottom sides of the dummy channels 310 remain slightly recessed (e.g., 1-2 nm) in the first encapsulation material 335.

FIG. 3H also illustrates a top view of the structure that shows only the metal line 115 and the hard mask 305. For example, the material on top of the metal line 115 such as the insulator 120 and the second STI 125 have been omitted from the top view. Further, the dotted box 390 illustrates a portion of the structure corresponding to the X and Y views while the portion of the metal line 115 to the left of the box 390 illustrate a portion of the metal line 115 that is not shown in X-view. Put differently, the dotted box 390 illustrates the portion of the structure that is shown in the X and Y-views. The portion of the top view to the left of the dotted box 390 view illustrates that the metal line 115 forms an interconnected buried bottom contact for the VFET.

Figure 3I:
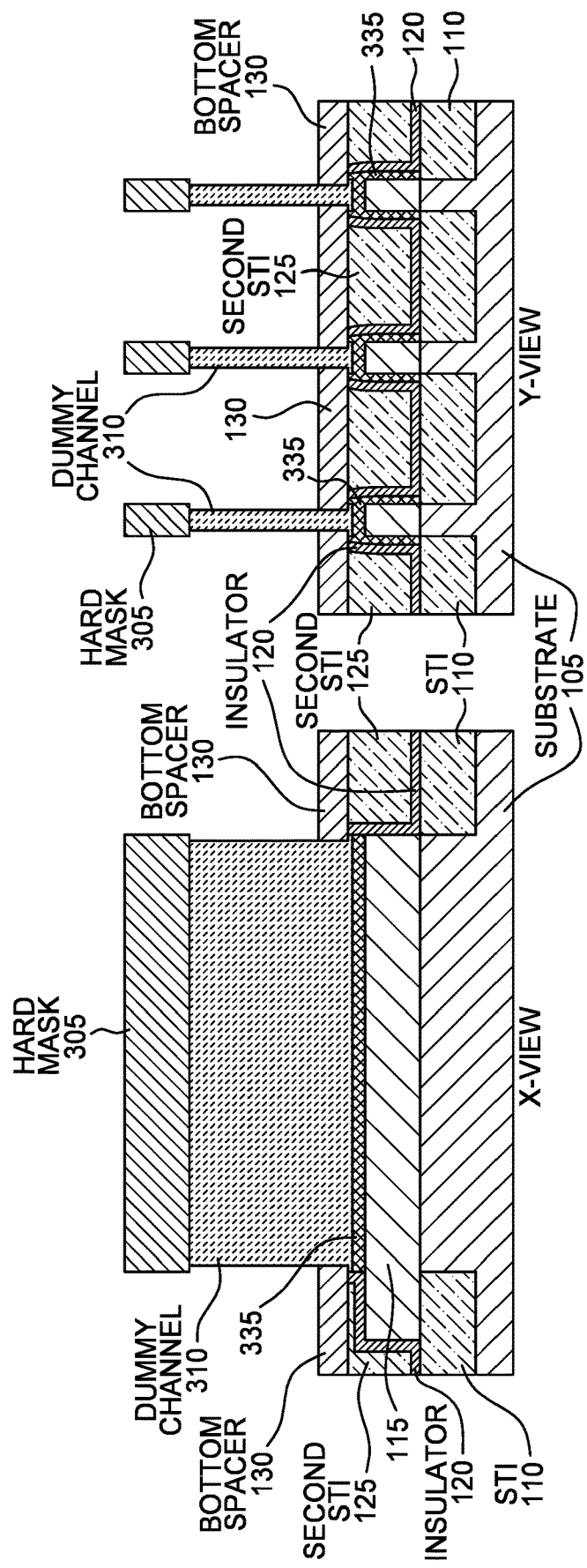

FIG. 3I illustrates the results of several processing steps. First, the dummy channels 310 in the fins are trimmed so that their width is reduced. Notably, the bottom ends of the channels 310 which are recessed into the first encapsulation material 335 are not affected by the trimming process, and thus, have the original width of the dummy channels 310. However, trimming the dummy channels 310 is an optional step. The dummy channels 310 may be formed with the desired width, and thus, would not have to be trimmed.

The bottom spacer 130 is then deposited onto the structure in the regions between, and around, the fins to result in the structure illustrated in FIG. 3I.

Figure 3J:
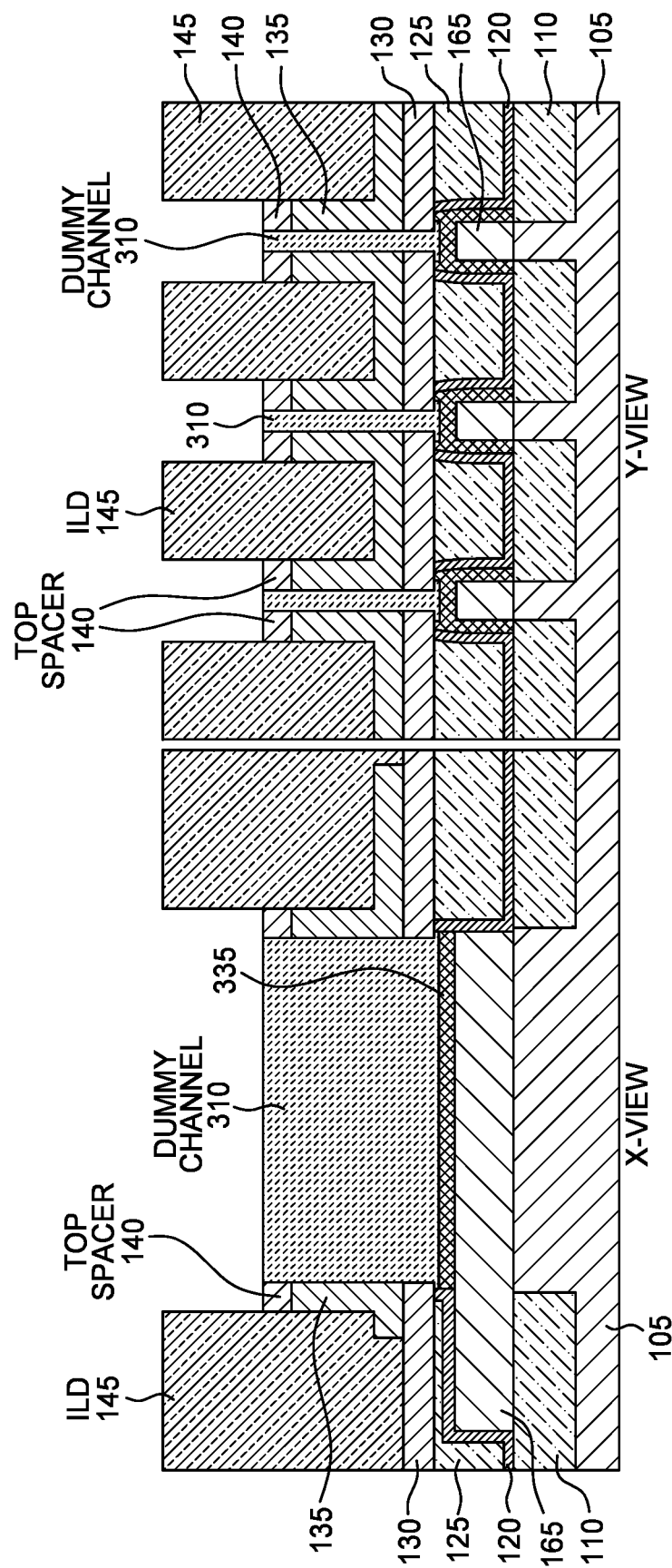

FIG. 3J illustrates depositing the metal of the gate 135 along the sides of the dummy channels 310. Although not shown, previously, a high-K dielectric can be deposited between the gate 135 and the sides of the dummy channel 310. The ILD 145 can then be deposited as shown. After forming the ILD 145, the top ends of the gate 135 can be recessed. The hard mask 305 can then be removed from the top of the dummy channels 310 and the top spacer 140 can then be formed in the space where the gate 135 was recessed.

Figure 3K:
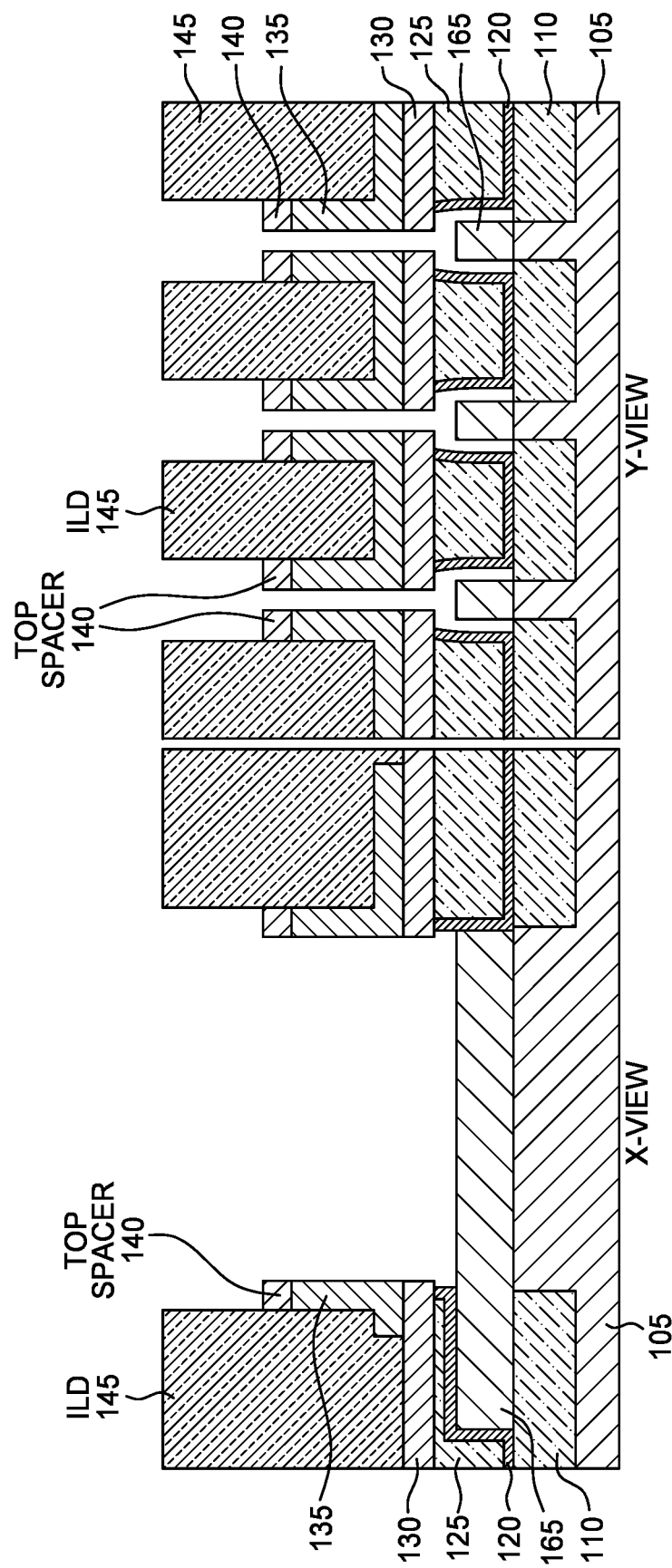

FIG. 3K illustrates removing the dummy channels 310 and the first encapsulation material 335. For example, if formed from silicon, a vapor phase silicon etch can be used to remove the dummy channels 310. Assuming the first encapsulation material 335 is AlOx, then a vapor phase AlOx etch can be used to remove this material. As shown by the Y-view, removing the first encapsulation material 335 exposes a volume that wraps around the top, left, and right sides of the metal line 115.

Although not shown, in one embodiment, a thin sacrificial TiN layer can be inserted between the high-k metal of the gate 135 and the dummy channel 310 when forming the gate 135 on the dummy channels 310. Doing so can protect the gate 135 from the etching process used to remove the dummy channels 310 and the first encapsulation material 335.

Figure 3L:
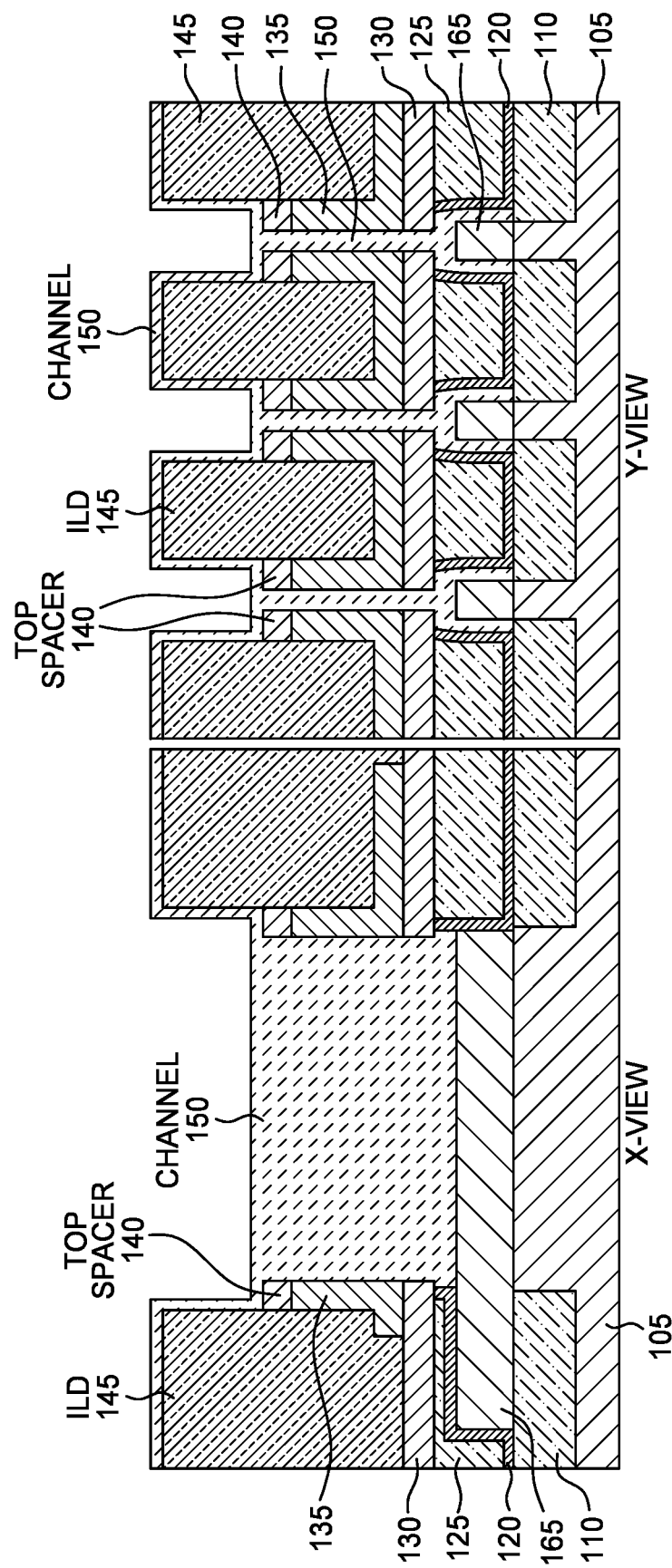

FIG. 3L illustrates depositing the "real" or permanent material of the channel 150 into the volumes that were previously occupied by the dummy channels 310 and first encapsulation material 335. In one embodiment, the material of the channel 150 is a 2D or 1D material, which may be especially useful when the channel 150 has a width that is 5 nm or less (e.g., 0.5-5 nm). However, other channel materials (e.g., silicon) may be used which can benefit from the channel 150 having a wrap-around contact with the metal line 115. The channel 150 may have a larger width (e.g., greater than 5 nm or greater than 12 nm) when silicon is used as the material.

In later processing steps (not shown here), the excess channel material can be removed from the top of the structure. Then, the top contact 155 can be formed in the top ends of the channels 150. Like with the metal line 115, the channel 150 also forms a wrap-around contact with the top contact 155. Thus, the top and bottom ends of the vertical channels 150 form female portions that connect with the male portions formed by the metal line 115 and the top contact 155.

Vias can then be formed in the structure to enable the contact 160A to connect the extension (left portion) of the metal line 115 and to enable the contact 160C to contact the gate 135. Further, the contact 160B can be formed on the top contact 155. These additional processing steps result in the VFET 100 shown in FIG. 1. In this manner, FIGS. 3A-3L illustrate one exemplary process for fabricating the VFET 100.

Assuming a 2D material is used to form the channel 150, in FIG. 1, the channel region is fully pinched-off by the 2D material to result in a true vertical 2D-channel GAA configuration. However, to form a channel region that is not pinched-off by the 2D material, instead of filling the entire volume vacated by the dummy channels 310 and the first encapsulation material 335 with the material of the channel, this volume is first lined with the 2D material and then the center is filled with an inserted dielectric. This results in the VFET 200 illustrated in FIG. 2 where the dielectric 205 (i.e., the inserted dielectric) is in the center of the channel 150. The VFET 200 is a vertical 2D-channel surround-gate configuration.

The steps described in FIGS. 3A-3L illustrate only some of the fabrication processes that can be used to form the VFETs 100 and 200 in FIGS. 1 and 2. The remaining portion of this document describes alternative processing methods.

In one alternative process, instead of forming recesses between the fins for depositing the first STI 110 as shown in FIGS. 3A and 3B, the fins may have a depth that is equal to, or slightly below the bottom side of the first sacrificial layer 320. That is, the first STI 110 is not formed during these processing steps. Later, after processing the structure to add the fin anchors 330, in this alternative process the second sacrificial layer 315 is removed first and replaced by the first encapsulation material 335 (e.g., AlO). The anchors can be removed and the second encapsulation material 340 is deposited over the structure. A STI can then be deposited between each of the fins at their bases.

The length of the fins can then be shortened, similar to FIG. 3F, and SiOC can be deposited at the ends of the fins. The SiOC pinches off the horizontal direction between the STI deposited between the fins. The SiOC at one end of the fins is masked while the SiOC at the other end of the fins is exposed so that this portion of the SiOC can be removed. Then, the first sacrificial layer 320 is removed. Notably, the fins are suspended by the first and second encapsulation layers. Further, the STI deposited between the fins, and the SiOC deposited at one end of the fins can also provide structural support to the fins when the first sacrificial layer 320 is removed.

The metal line 115 is then deposited to replace the removed first sacrificial layer 320. In addition, the metal line 115 includes an extension on the end of the fin where the portion of the SiOC was removed. This extension forms a landing to connect the metal line 115 to the contact 160A.

The bottom spacer 130 can then be formed on the structure (with a portion directly on the extension of the metal line 115). The gate 135 and the ILD 145 can then be formed, similar to FIG. 3J. The dummy channel 310 and the first encapsulation material 335 can then be removed and replaced by the material of the channel 150. The top contact 155 and the contacts 160A-C can then be formed to complete the VFET. Further, this VFET can include a true-vertical 2D channel GAA configuration similar to FIG. 1, or a dielectric can be inserted into the channel 150 to form a vertical 2D-channel surround-gate configuration similar to FIG. 2.

Another alternative process can be used that is compatible with back end of line (BEOL) integration for 3D-monolithic applications. In this alternative process, the structure shown in FIG. 3A is modified so that the substrate 105 is a N-1 functional layer that can include logic (CMOS circuitry), memory, an interconnect, etc. Further, instead of having a second sacrificial layer 315, this layer is replaced with the same material as the first encapsulation material discussed above (e.g., AlOx). Thus, in this example, the structure only has one sacrificial layer (i.e., layer 320). Moreover, the dummy channel 310 may be formed from amorphous silicon rather than crystalline silicon.

In addition, the fins may be etched to only the bottom surface of the first sacrificial layer 320, rather than being etched below this layer as shown in FIG. 3A. This is because for a BEOL process, the substrate 105 may already include functional components (e.g., logic, memory, or an interconnect) which may be destroyed or harmed if the substrate 105 is etched.

Once the fins are formed, additional first encapsulation material is deposited on the sides of the fins at their bases. Doing so results in the same arrangement of the first encapsulation material 335 shown in FIG. 3E.

The second encapsulation material 340 can then be deposited over the fins similar to FIG. 3F. Further, SiCOH can be deposited in the region between the fins to provide additional structural support to the fins.

The length of the fins can then be shortened and SiOC can be deposited at the ends of the fins. Like in the previous alternative process, the portion of the SiOC at one end of the fins is masked while the portion of the SiOC on the other end is not. This portion of the SiOC is removed. At this point, the first sacrificial layer 320 is removed. When removing the layer 320, the fins are suspended by the first and second encapsulation materials and the SiCOH that was deposited between the fins at their bases.

The metal line 115 is then deposited in the space vacated by the first sacrificial layer 320 and in the space that was vacated by the portion of the SiOC at one end of the fins to provide a landing of the metal line 115 to make an electrical connection with the contact 160A.

The first and second encapsulation materials 335, 340 can be etched as shown in FIG. 3H so that the bottom end of the dummy channels 310 are recessed into the first encapsulation material 335. If desired, the dummy channels 310 can then be trimmed.

The bottom spacer 130, gate 135, and the ILD 145 can then be formed. The dummy channels 310 can then be removed and replaced by the material of the channel 150. The top contact 155 can then be formed. In one embodiment, the contacts 160A-C are also formed to complete the VFET. However, in another embodiment, instead of connecting the metal line 115 to the top of the VFET using the contact 160A, the metal line 115 can be connected to a N-1 level interconnect line in the substrate 105. That is, the contact 160A can be omitted and the metal line 115 is connected to an interconnect line in the substrate 105. In that case, the metal line 115 would also not need the extension to form a landing for the contact 160A.

Further, this VFET can include a true-vertical 2D channel GAA configuration similar to FIG. 1, or a dielectric can be inserted into the channel 150 to form a vertical 2D-channel surround-gate configuration similar to FIG. 2.

The next alternative process is another process that is compatible with BEOL integration for 3D-monolithic applications. In this alternative BEOL process, the structure shown in FIG. 3A is modified so that the substrate 105 can be a N-1 functional layer that can include logic (CMOS circuitry), memory, an interconnect, etc., similar to the previous process. However, unlike the previous process that had one sacrificial layer (i.e., the first sacrificial layer 320), this alternative process does not use any sacrificial layers. Instead, the second sacrificial layer 315 is replaced with the same material as the first encapsulation material discussed above (e.g., AlOx) and the first sacrificial layer 320 is replaced with the metal line 115. Moreover, the dummy channel 310 may be formed from amorphous silicon rather than crystalline silicon.

In addition, the fins may be etched to only the bottom surface of the first sacrificial layer 320 (which is the buried metal line 115 in this example), rather than being etched below this layer as shown in FIG. 3A. This is because for a BEOL process, the substrate 105 may already include functional components (e.g., logic, memory, or an interconnect) which may be destroyed or harmed if the substrate 105 is etched.

Once the fins are formed, additional first encapsulation material (e.g., more AlOx) is deposited on the sides of the fins at their bases. Doing so results in the same arrangement of the first encapsulation material 335 shown in FIG. 3E.

The second encapsulation material 340 can then be deposited over the fins similar to FIG. 3F. Further, SiCOH can be deposited in the region between the fins to provide additional structural support of the fins.

The length of the fins can then be shortened and SiOC can be deposited at the ends of the fins. In this process, the length of the fin is then shortened again to expose a portion of the metal line 115. That is, the hard mask 305, dummy channel, and the first encapsulation material are removed at one end to expose a portion of the underlying metal line 115.

The first and second encapsulation materials 335, 340 can be etched as shown in FIG. 3H so that the bottom end of the dummy channels 310 are recessed into the first encapsulation material 335. If desired, the dummy channels 310 can then be trimmed.

The bottom spacer 130, gate 135, and the ILD 145 can then be formed. The dummy channels 310 can then be removed and replaced by the material of the channel 150. The top contact 155 and the contacts 160A-C are also formed to complete the VFET. By shortening the length of the fins twice, this provides an extension of the metal line 115 to serve as a landing for coupling the metal line 115 to the contact 160A.

Further, this VFET can include a true-vertical 2D channel GAA configuration similar to FIG. 1, or a dielectric can be inserted into the channel 150 to form a vertical 2D-channel surround-gate configuration similar to FIG. 2.

Figure 4:
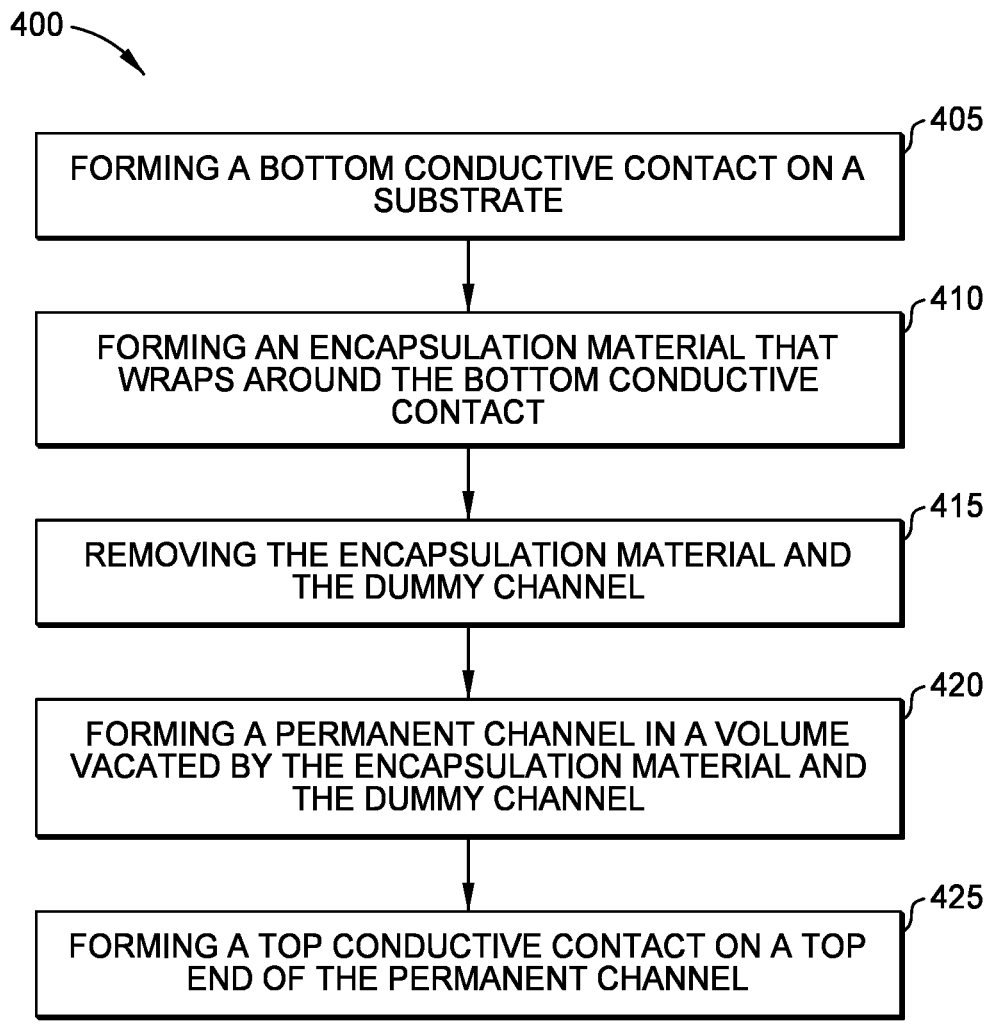
FIG. 4 is a flowchart for forming a VFET with female/male connections, according to one embodiment.

FIG. 4 is a flowchart of a method 400 for forming a VFET with female/male connections, according to one embodiment. At block 405, a bottom conductive contact (e.g., metal line 115) is formed on a substrate (e.g., substrate 105). In one embodiment, the bottom conductive contact is formed after the dummy channels is formed as is the case in the process illustrated in FIGS. 3A-3L. However, in one of the alternative BEOL processes discussed above, the bottom conductive contact may be formed on the substrate before the dummy channels.

At block 410, an encapsulation material (e.g., the first encapsulation material 335) is formed that wraps around the bottom conductive contact. In one embodiment, the encapsulation materials contacts at least three sides of the bottom conductive contact—e.g., a top side, left side, and right side. But in other embodiments, the encapsulation material may contact additional sides of the bottom conductive contact (e.g., front and back sides).

At block 415, the encapsulation material and the dummy channel are removed.

At block 420, a permanent channel (e.g., the channel 150) is formed in a volume vacated by the first encapsulation material and the dummy channel. In one embodiment, an end of the permanent channel (e.g., its bottom end) wraps around the bottom conductive contact, like the encapsulation material. The end of the permanent channel can form a female portion of a female/male connection while the bottom conductive contact forms a male portion.

In one embodiment, the permanent channel is a vertical channel in a VFET. The permanent channel may have a width that is less than 5 nm, but may alternatively have a width that is greater than 5 nm. In one embodiment, when the permanent channel has a width 5 nm or less, it is formed from 2D materials (transition metal dichalcogenide material such as $MoS_2$, $MoSe_2$, $MoTe_2$, $HfS_2$, $ZrS_2$, $WS_2$, $WSe_2$, SnS, or hexagonal boron nitride h-BN, or at least one oxide-semiconductor such as ITO, ZnO, IGZO, InGaZnO, InAlZnO, or Graphene,) or 1D materials (e.g., carbon nanotubes). However, the permanent channel can have a width that is greater than 5 nm, in which case, it can be formed from 2D materials, 1D materials, other more traditional channel materials such as silicon or other semiconductors.

At block 425, a top conductive contact (e.g., the top contact 155) is formed at a top end of the permanent channel. The top end of the channel may be the opposite end of the end of the channel connected to the bottom conductive contact. Further, in one embodiment, the top end of the channel wraps around the top conductive contact—e.g., contacts the top conductive contact on at least three sides. The top end of the permanent channel can form a female portion of a female/male connection while the top conductive contact forms a male portion. Thus, the channel can connected to conductors at both its top and bottom ends using female/male connections.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A vertical field-effect transistor (VFET) comprising:
a vertical channel;
a top conductive contact for one of a drain or source region, wherein a top end of the vertical channel wraps around the top conductive contact; and
a bottom conductive contact disposed on a substrate for one of a drain or source region, wherein a bottom end of the vertical channel wraps around the bottom conductive contact, and wherein the bottom end of the vertical channel and the bottom conductive contact both directly contact the substrate.

2. The VFET of claim 1, wherein the top end of the vertical channel contacts at least three sides of the top conductive contact and the bottom end of the vertical channel contacts at least three sides of the bottom conductive contact.

3. The VFET of claim 1, wherein a width of the vertical channel is less than 5 nm.

4. The VFET of claim 3, wherein the vertical channel comprises at least one of MoS2, MoSe2, MoTe2, HfS2, ZrS2, WS2, WSe2, SnS, hexagonal boron nitride h-BN, an oxide-semiconductor, Graphene, or carbon nanotubes.

5. The VFET of claim 1, wherein the bottom conductive contact is a buried metal line.

6. The VFET of claim 1, wherein the bottom conductive contact and the top conductive contact are both wider than a portion of the vertical channel with the smallest width.

7. A field-effect transistor (FET) comprising:
a channel;
a first conductive contact for one of a drain or source region, wherein a first end of the channel and the first conductive contact form a first female/male connection; and
a second conductive contact for one of a drain or source region, wherein a second end of the channel opposite the first end and the second conductive contact form a second female/male connection, and wherein the channel has a first width between the first and second conductive contacts and a second width at the first and second ends, the second width being greater than the first width.

8. The FET of claim 7, wherein the channel is a vertical channel in a vertical FET.

9. The FET of claim 8, wherein the first end of the vertical channel and the first conductive contact both directly contact a common substrate.

10. The FET of claim 7, wherein the first end of the channel is a first female portion and the first conductive contact is a first male portion of the first female/male connection, and the second end of the channel is a second female portion and the second conductive contact is a second male portion of the second female/male connection.

11. The FET of claim 7, wherein the first end of the channel contacts at least three sides of the first conductive contact and the second end of the channel contacts at least three sides of the second conductive contact.

12. The FET of claim 7, wherein a width of the channel is less than 5 nm.

13. The FET of claim 11, wherein the channel comprises at least one of $MoS_2$, $MoSe_2$, $MoTe_2$, $HfS_2$, $ZrS_2$, $WS_2$, $WSe_2$, SnS, hexagonal boron nitride h-BN, an oxide-semiconductor, Graphene, or carbon nanotubes.

14. The FET of claim 7, wherein the first conductive contact is a buried metal line.

15. The FET of claim 7, wherein the first and second conductive contacts are both wider than a portion of the channel with the smallest width.

16. A field-effect transistor (FET) comprising:
a channel;
a first conductive contact for one of a drain or source region, wherein a first end of the channel and the first conductive contact form a first female/male connection; and
a second conductive contact for one of a drain or source region, wherein a second end of the channel opposite the first end and the second conductive contact form a second female/male connection, wherein the first end of the channel and the first conductive contact both directly contact a common substrate.

17. The FET of claim 16, wherein the first end of the channel contacts at least three sides of the first conductive contact and the second end of the channel contacts at least three sides of the second conductive contact.

18. The FET of claim 16, wherein a width of the channel is less than 5 nm.

19. The FET of claim 16, wherein the channel comprises at least one of $MoS_2$, $MoSe_2$, $MoTe_2$, $HfS_2$, $ZrS_2$, $WS_2$, $WSe_2$, SnS, hexagonal boron nitride h-BN, an oxide-semiconductor, Graphene, or carbon nanotubes.

20. The FET of claim 16, wherein the first and second conductive contacts are both wider than a portion of the channel with the smallest width.

* * * * *